United States Patent
Chen

(10) Patent No.: US 12,326,461 B2
(45) Date of Patent: Jun. 10, 2025

(54) TEST SOCKET CONNECTOR HAVING LATCH WITH A BOTTOM GUIDING PORTION

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Ming-Yue Chen, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 289 days.

(21) Appl. No.: 17/944,315

(22) Filed: Sep. 14, 2022

(65) Prior Publication Data

US 2023/0084745 A1 Mar. 16, 2023

(30) Foreign Application Priority Data

Sep. 16, 2021 (CN) .......................... 202111083373.6

(51) Int. Cl.
  *H01R 33/74* (2006.01)
  *G01R 1/04* (2006.01)
  *G01R 31/28* (2006.01)
  *H01R 13/639* (2006.01)

(52) U.S. Cl.
  CPC ....... *G01R 1/0466* (2013.01); *G01R 31/2886* (2013.01); *H01R 13/639* (2013.01); *H01R 33/74* (2013.01)

(58) Field of Classification Search
  CPC .......................... G01R 1/0466; G01R 31/2886; H01R 13/639; H01R 33/74; H01R 2201/20; H01R 12/85; H01R 12/88; H05K 7/1007
  See application file for complete search history.

(56) References Cited

U.S. PATENT DOCUMENTS

| | | | | |
|---|---|---|---|---|
| 6,666,691 B2* | 12/2003 | Ikeya | ................... | H05K 7/1069 439/71 |
| 6,739,894 B2* | 5/2004 | Ogura | ................ | H01R 13/2421 439/71 |
| 6,749,443 B2* | 6/2004 | Sano | ................... | H01R 13/2485 439/71 |
| 6,848,928 B2* | 2/2005 | Ikeya | ................... | G01R 1/0483 439/330 |
| 7,118,386 B2* | 10/2006 | Sato | ..................... | G01R 1/0483 439/73 |
| 8,062,043 B2* | 11/2011 | Chen | .................... | H05K 7/1007 439/266 |

(Continued)

FOREIGN PATENT DOCUMENTS

CN 202695852 U 1/2013

*Primary Examiner* — Tho D Ta
(74) *Attorney, Agent, or Firm* — Ming Chieh Chang

(57) ABSTRACT

An electrical connector includes: a base and a contact module received by the base; a cover movably disposed relative to the base; and a latch mechanism including a pair of latches pivotably disposed relative to the cover and rotatably disposed relative to the base, wherein each of the pair of latches has an upper guiding portion and the base has a corresponding portion for engaging the upper guiding portion.

3 Claims, 4 Drawing Sheets

(56) References Cited

U.S. PATENT DOCUMENTS 10,241,132 B2  3/2019  Hwang et al.
2003/0054676 A1* 3/2003  Sano .................... G01R 1/0466
                                                      439/73

* cited by examiner

TEST SOCKET CONNECTOR HAVING LATCH WITH A BOTTOM GUIDING PORTION

BACKGROUND OF THE INVENTION

Field of the Invention

The present invention relates to an electrical connector comprising: a base and a contact module received by the base; a cover movably disposed relative to the base; and a latch mechanism including a pair of latches pivotably disposed relative to the cover and rotatably disposed relative to the base, wherein each of the pair of latches is designed to provide a smooth movement during operation.

Description of Related Arts

China Patent No. 202695852 discloses an electrical connector comprising: a base and a contact module received by the base; a cover movably disposed relative to the base; and a latch mechanism including a pair of latches pivotably disposed relative to the cover and rotatably disposed relative to the base. The latch is coupled to the cover by an axle and to the base by a pair of pivots. Movement of these pivots may not provide a smooth operation of the latches.

SUMMARY OF THE INVENTION

An electrical connector comprises: a base and a contact module received by the base; a cover movably disposed relative to the base; and a latch mechanism including a pair of latches pivotably disposed relative to the cover and rotatably disposed relative to the base, wherein each of the pair of latches has an upper guiding portion and the base has a corresponding portion for engaging the upper guiding portion

DETAILED DESCRIPTION OF THE DRAWINGS

Figure 1:
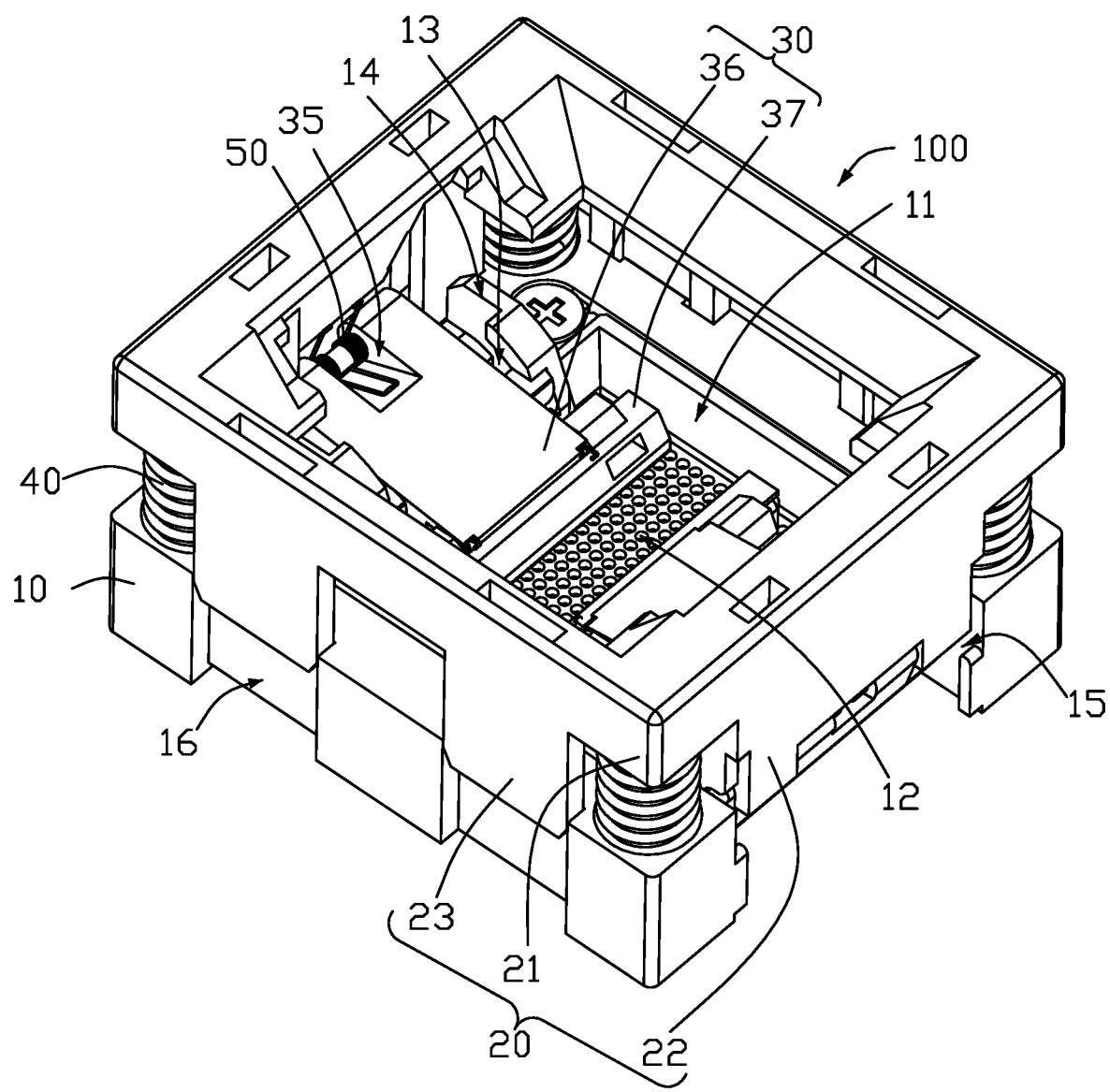
FIG. 1 is a perspective view of an electrical connector in accordance with the present invention.
Figure 2:
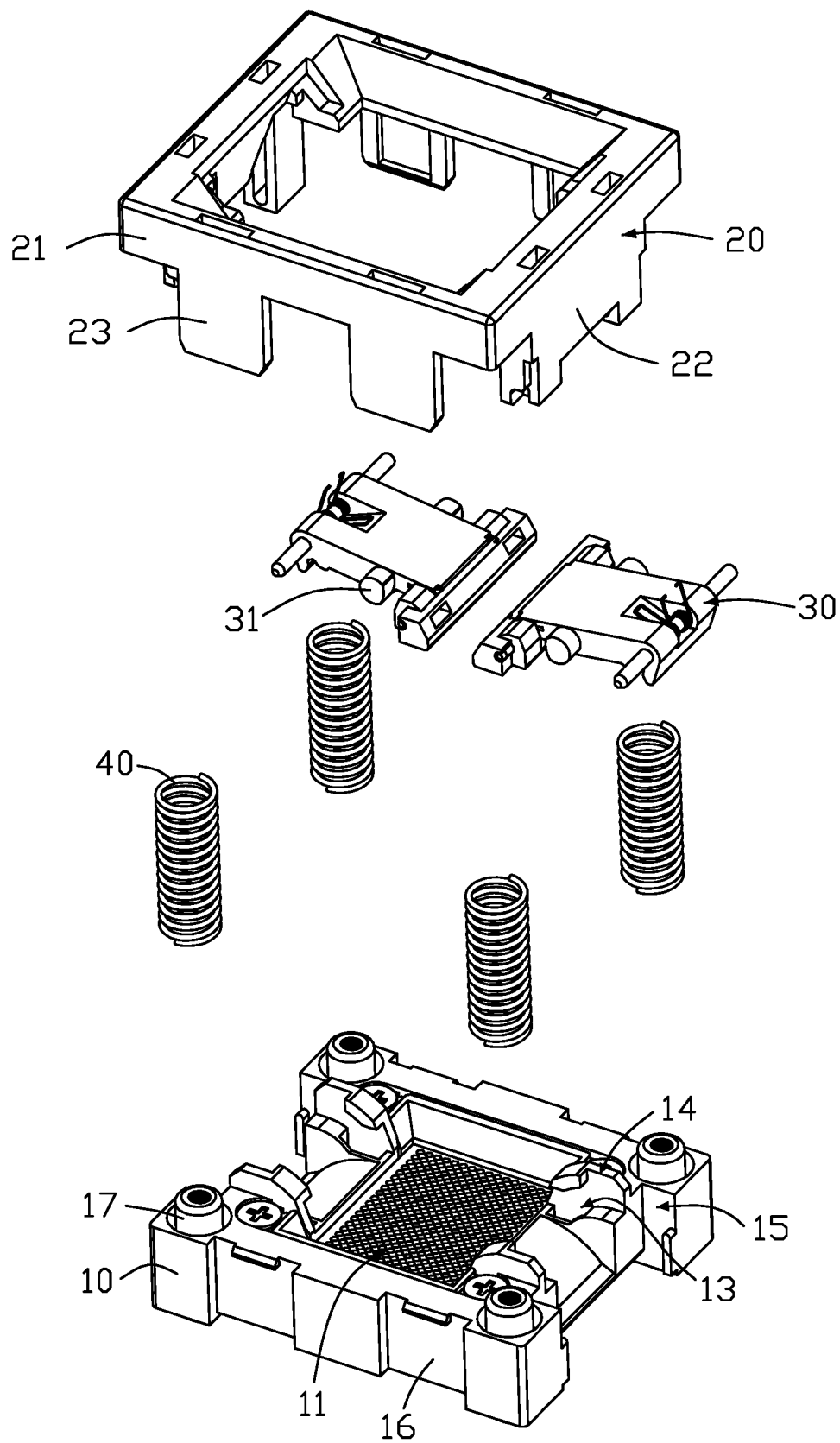
FIG. 2 is an exploded view of the electrical connector.

Referring to FIGS. 1-4, an electrical connector 100 features a burn-in test socket for a semiconductor device or integrated circuit (IC) package. The electrical connector 100 comprises a base 10 receiving a contact module to define a space 11, a floating cover 20 movably disposed relative to the base 10, and a latch mechanism including a pair of latches 30 pivotably disposed relative to the cover 20 and rotatably disposed relative to the base 10. The contact module has passageways 12 and spring probes or contacts in the passageways, which is of a construction well known in this art.

The base 10 has grooves 13 and the latch 30 has a pair of pivots 31 movably received in a corresponding pair of grooves 13. Another pivot or axle extends through the latch 30 and is coupled to the cover 20 so that a downward movement of the cover 20 relative to the base 10 enables the pair of pivots 31 to move along the corresponding pair of grooves 13, thereby moving the latch 30 out of the space 11 for loading an IC package. The groove 13 is exposed at an upper thereof through an opening 14 for entry of the pivot 31.

The cover 20 has a body 21, a first extension 22 consisting of a pair of extending portions, and a second extension 23 also consisting of a pair of extending portions. The base 10 has a pair of first channels 15 receiving the first extension 22 and a pair of second channels 16 receiving the second extension 23. Four springs 40 are disposed between the base 10 and the cover 20 and designed to urge the cover 20 toward an uppermost position where the latches 30 are at a locked position pressing against a loaded IC package in the space 11. The cover 20 is operable to move downward against the force of springs 40 in order to move the latches 30 to an unlocked position where the loaded IC package may be removed or another IC package may be loaded. The base 10 may have posts 17 for positioning the springs 40.

Each of the pair of latches 30 has an upper guiding portion 32 and the base 10 has a corresponding portion 18 for engaging the upper guiding portion 32. During a later stroke of movement of the latch 30 toward the unlocked position, engagement of the upper guiding portion 32 and the corresponding portion 18 assists in smoothly rotating the latch 30 while the pair of pivots 31 are guided by the pair of grooves 13. Each of the pair of latches 30 may further have a lower guiding portion 33 for engaging the corresponding portion 18 of the base 10. Similarly, during an initial stroke of movement of the latch 30 from the unlocked position toward the locked position, engagement of the lower guiding portion 33 and the corresponding portion 18 assists in smoothly rotating the latch 30 while the pair of pivots 31 are guided by the pair of grooves 13.

Figure 3:
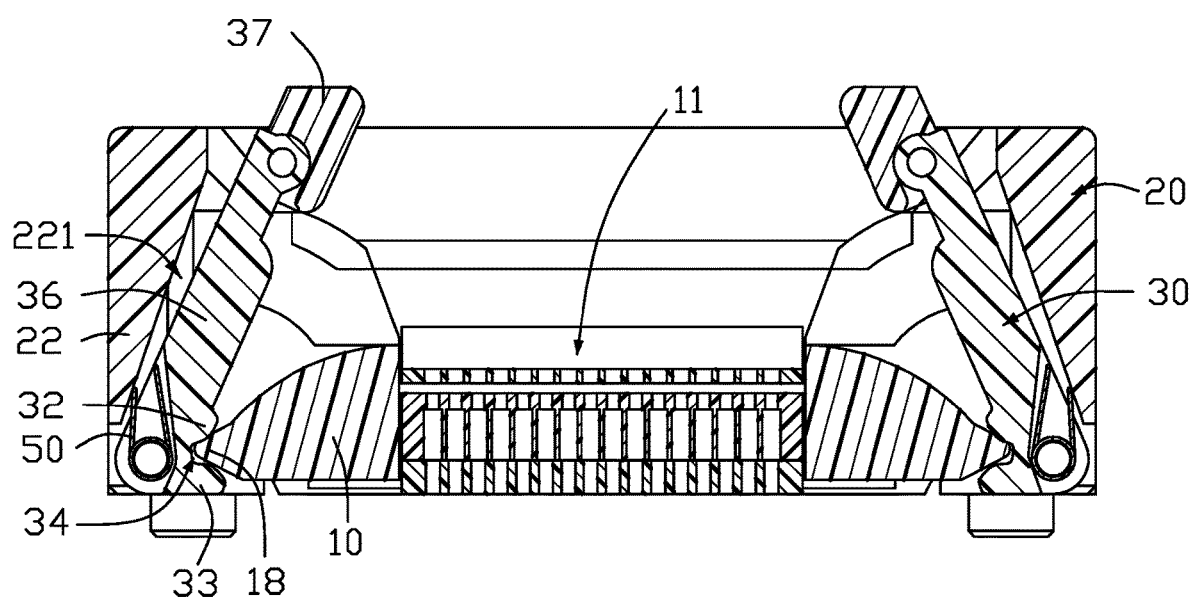
FIG. 3 is a cross-sectional view of the electrical connector.
Figure 4:
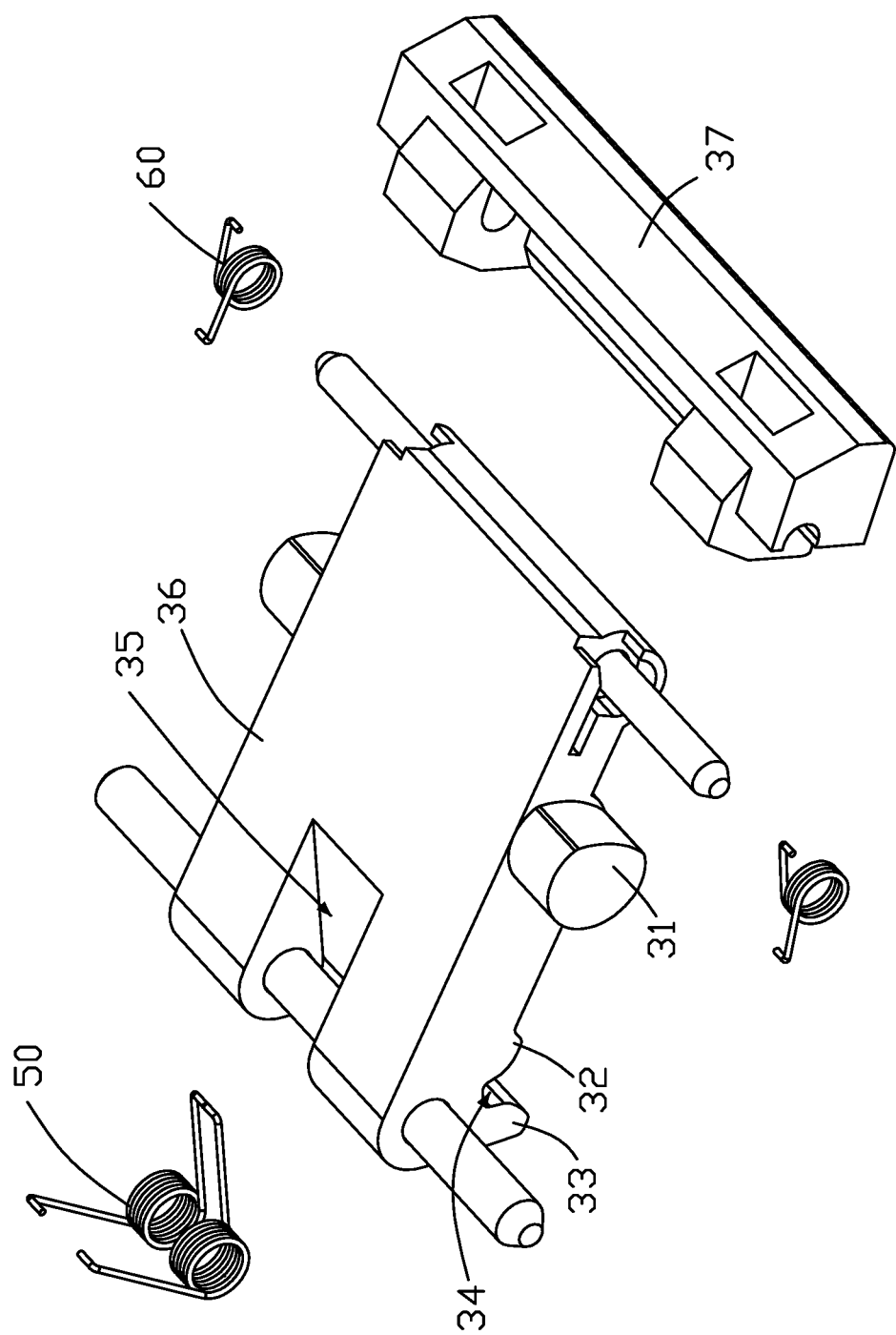
FIG. 4 is an exploded view showing part of a latch mechanism of the electrical connector.

The upper guiding portion 32 and the lower guiding portion 33 of each latch 30 form a substantially V-shaped notch and the corresponding portion 18 of the base 10 forms a substantially V-shaped protrusion. The upper guiding portion 32 and the lower guiding portion 33 are separated by a space 34 for receiving the corresponding portion 18 of the base 10. Therefore, when the latch 30 is at the unlocked position as shown in FIG. 3, the corresponding portion 18 of the base 10 is generally located in the substantially V-shaped notch defined by the upper and lower guiding portions 32 and 33 of the latch 30 and each latch 30 is received in a corresponding slot of the first extension 22 of the cover 20. The latch 30 is pivotably mounted to the first extension 22 of the cover 20. When the portion 18 of the base 10 is located in the substantially V-shaped notch defined by the upper and lower guiding portions 32 and 33 of the latch 30, each latch 30 is received in a corresponding slot 221 of the first extension 22 of the cover 20.

A spring 50 may be disposed between each latch 30 and the first extension 22 of the cover 20 to keep the latch 30 in positive contact with a loaded IC package. The spring 50 may be a torsional spring placed around the axle of the latch 30 in a notch 35 thereof.

The latch 30 may include a body 36 and a pad 37 pivoted to the body 36 for engaging a loaded IC package. A pair of springs 60 are disposed between the body 36 and the pad 37. The upper guiding portion 32 and the lower guiding portion 33 are located at a bottom of the latch 30 near the axle.

With provision of the upper guiding portion 32 on the latch 30 and the portion 18 on the base 10 to regulate operation of the latch 30, a smooth movement of the latch 30 may be obtained. In prior art design, at the unlocked position shown in FIG. 3 where the latch 30 is oriented at about 69 degrees, a smooth operation for the latch 30 would be difficult to achieve (either to reach this orientation of the latch or to start moving the latch away from this orientation) solely relying on the pair of pivots 31 being guided within the pair of grooves 13.

What is claimed is:

1. An electrical connector comprising:
   a base and a contact module received by the base;
   a cover movably disposed relative to the base; and
   a latch mechanism including a pair of latches pivotably disposed relative to the cover and rotatably disposed relative to the base for being capable of moving between a locked position and an unlocked position; wherein
   each of the pair of latches has an upper guiding portion and a lower guiding portion and the base has a corresponding portion for engaging the upper guiding portion and the lower guiding portion;
   during a later stroke of movement of the latch toward the unlocked position, engagement of the upper guiding portion and the corresponding portion of the base assists in rotating the latch; and
   during an initial stroke of movement of the latch from the unlocked position toward the locked position, engagement of the lower guiding portion and the corresponding portion of the base assists in rotating the latch.

2. The electrical connector as claimed in claim 1, wherein the upper guiding portion and the lower guiding portion of each latch form a substantially V-shaped notch and the corresponding portion of the base forms a substantially V-shaped protrusion.

3. The electrical connector as claimed in claim 1, wherein the upper guiding portion and the lower guiding portion of each latch form a substantially V-shaped notch defining an acute angle.

* * * * *